United States Patent
Oosaki

(10) Patent No.: US 6,768,287 B2
(45) Date of Patent: Jul. 27, 2004

(54) SYSTEM FOR CENTRALLY MONITORING STATE INFORMATION OF BATTERIES

(75) Inventor: Yoshiki Oosaki, Maebashi (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/265,718

(22) Filed: Oct. 8, 2002

(65) Prior Publication Data

US 2003/0169019 A1 Sep. 11, 2003

(30) Foreign Application Priority Data

Mar. 6, 2002 (JP) ........................................ 2002-060485

(51) Int. Cl.⁷ .............................................. H01M 10/46
(52) U.S. Cl. ...................................................... 320/132
(58) Field of Search ................................ 320/116, 128, 320/132, 149; 324/426, 427, 430, 433

(56) References Cited

U.S. PATENT DOCUMENTS 6,072,299 A * 6/2000 Kurle et al. ................. 320/112

FOREIGN PATENT DOCUMENTS

| JP | 60-25465 | 2/1985 |
|----|----------|--------|
| JP | 10-187296 | 7/1998 |

* cited by examiner

*Primary Examiner*—Edward H. Tso
(74) *Attorney, Agent, or Firm*—Staas & Halsey LLP

(57) ABSTRACT

A battery monitoring and control unit 52 monitors a battery 51 mounted in each of a plurality of terminals installed in a retail store. Total operating time during which the terminal has been operated by the battery, number of recharges that have been performed on the battery, or actual operating time during which the terminal has been operated on a single charge of the battery after completion of charging, is monitored. End-of-life time is predicted according to the state of consumption of the battery. Battery state information including the end-of-life time is transmitted at periodic intervals to a server 4 and transferred to a host 11. Based on the received end-of-life time, the host indicates on a store-by-store basis any terminal that is to be subjected to battery maintenance scheduled next time.

17 Claims, 4 Drawing Sheets

SYSTEM FOR CENTRALLY MONITORING STATE INFORMATION OF BATTERIES

TECHNICAL FIELD OF THE INVENTION

The present invention relates to a battery monitoring system and, more particularly, to a battery monitoring system that can centrally monitor, at a host, the state of secondary batteries (hereinafter referred to as batteries) mounted in terminals such as terminals operating in a client/server environment or terminals having an online connection capability.

BACKGROUND RELATED ART

Traditionally, rechargeable batteries are used as power supplies in notebook computers and other portable information terminals such as handheld terminals and palmtop terminals. These electronic apparatuses are operated by the power supplied from such batteries.

However, the power that can be supplied through discharge of a battery is generally limited by the amount to which the battery is charged, and when the battery becomes low, it must be recharged. Further, the battery lifetime, as a power supply, is limited as the battery characteristics degrade through repeated discharging and charging. Finally, the battery itself has to be replaced by a new one.

Here, as the battery is usually mounted inside an apparatus, and since it is not possible to see the internal condition of the battery, it is difficult to know the state of the battery, such as the remaining capacity in the battery, from outside the battery. This may result in a situation where, during the use of the apparatus, the battery is exhausted, rendering the apparatus inoperable. Furthermore, as is often the case, the battery is replaced only after it is noticed that the battery is no longer rechargeable.

To avoid such situations, various strategies have been proposed that detect the operating state of the battery mounted in an apparatus and alert the user of the apparatus to the detected state.

For example, it is practiced to detect the output voltage of the battery mounted in the apparatus and, based on the result of the detection, visually indicate the remaining capacity of the battery on the display unit of the apparatus or produce an indication or notification alerting the user that the battery is low and needs recharging. In response to such an indication or notification, the user of the apparatus recharges the battery.

In the case of electronic apparatus such as terminals operating in a client/server environment where a plurality of terminals can connect to a server, it is also practiced for the server to centrally monitor the output voltage of the battery mounted in each terminal.

In some implementations, the remaining capacity of the battery in each terminal is centrally monitored at the server which, based on the remaining capacity, determines whether the terminal has enough battery capacity to be able to continue operation; if the remaining battery capacity is too low to continue operation, the battery of that terminal is recharged. This is to prevent a situation where the battery of the terminal is exhausted during data transfer between the client and the server, causing an interruption in the data transfer and resulting in an apparatus operation error.

Traditionally, monitoring of the battery mounted in an electronic apparatus has been performed mainly to have the battery recharged or to extend the battery life. Accordingly, in the prior art, it has been practiced to replace the battery by predicting battery replacement time from elapsed time based on the battery life predefined in terms of operating hours and the number of recharges, or after an operational trouble attributable to the battery has occurred.

In the prior art, it has not been possible to accurately determine the battery replacement time based on the battery life, because the life of the battery mounted in an electronic apparatus varies depending on its conditions of use, frequency of use, and further on the battery characteristics that differ for each individual battery. In particular, when a plurality of terminals are installed in a retail store or an office, it is standard practice to perform replacement and maintenance work on the batteries mounted in the respective terminals collectively on a store-by-store or office-by-office basis; as a result, in such cases where, of the plurality of terminals, some terminals have been used more frequently than the others, it has been practiced, from the viewpoint of maintenance efficiency, to replace the batteries that have not yet reached the end of life, together with the batteries that are no longer serviceable and should therefore be replaced, thus resulting in wasteful replacement.

The prior art, therefore, has had the problem that the change in the battery life cannot be monitored in real time and accurately because the purpose is limited to the method of charging the battery mounted in an electronic apparatus or to the extension of the battery life.

It is accordingly an object of the present invention to provide a battery monitoring system wherein, for the batteries mounted in terminals, the operating state of each battery is centrally monitored at the host, thereby preventing the occurrence of trouble and achieving efficient, effective, and appropriate battery replacement and maintenance work.

SUMMARY OF THE INVENTION

To solve the above problem, according to the present invention, a battery monitoring system for monitoring the batteries mounted in a plurality of electronic apparatuses and used to operate the electronic apparatuses comprises: battery monitoring means for gathering battery state information concerning the battery mounted in each electronic apparatus; battery monitoring and controlling means for determining, based on the battery state information, whether the battery has reached an end-of-life time; and output means for outputting the battery state information including the end-of-life time.

The battery state information includes total operating time during which the electronic apparatus has been operated by the same battery mounted therein, wherein the total operating time is obtained by detecting a power off state of the electronic apparatus and by sequentially adding up the operating time during which the electronic apparatus has been operated by the battery.

Further, the battery state information includes the number of recharges that have been performed on the same battery mounted in the electronic apparatus, or includes actual operating time during which the electronic apparatus has been operated by the same battery on a single charge after completion of charging, wherein the actual operating time is obtained by measuring the time elapsed from completion of a recharge until a battery output voltage being monitored by the battery monitoring means drops to a predetermined voltage.

The battery monitoring and controlling means, when determining whether the end-of-life time of the battery has been reached, can refer to a consumption level index that has been set according to the conditions of use of the battery; the battery monitoring and controlling means can also acquire the battery state information including an error event associated with the same battery mounted in the electronic apparatus and the number of occurrences thereof, and can determine, based on the information, whether the end-of-life time of the battery has been reached.

The electronic apparatus is an information terminal, and the output means transmits the battery state information, including the end-of-life time, at periodic intervals to a server connected to the information terminal, wherein the server is installed in a retail store or the like, manages a plurality of information terminals, and transfers the battery state information to a host connected to the server, and the host indicates, for each store or the like, any information terminal that is to be subjected to battery maintenance scheduled next time.

BRIEF DESCRIPTION OF THE DRAWINGS

These and other objects and features of the present invention will become clearer from the following description of the preferred embodiments given with reference to the attached drawings, wherein.

DETAILED DESCRIPTION OF THE INVENTION

Next, an embodiment of a battery monitoring system according to the present invention will be described with reference to FIGS. 1 to 4.

As previously described, the battery monitoring according to the prior art has been limited to detecting the remaining capacity of the battery mounted in a terminal and alerting the user of the apparatus to the result of the detection or, depending on the result of the detection, automatically recharging the battery, and the replacement of the mounted battery has been performed without considering the conditions of use of the battery, individual differences in battery characteristics, etc., but by determining that an end of life is reached when a predetermined length of time has elapsed, or after an operational trouble attributable to the battery has occurred.

In contrast, in the battery monitoring system of this embodiment, the battery state of the battery mounted in a terminal is monitored in real time by the CPU built in the terminal and, based on this battery state information, management of the mounted battery is performed and the time at which the battery is expected to reach the end of its life is predicted. Battery maintenance is performed based on the result of this end-of-life prediction.

In an environment where a plurality of terminals are installed in a retail store, an office, a factory, or the like (hereinafter represented by the retail store) and managed by an in-store server, and where the server is connected to a host in a management center that manages a plurality of retail stores, battery state information concerning the battery of each terminal is gathered at periodic intervals, for example, once a day, and the battery state information thus gathered is transmitted to the host. The host monitors the battery state information received from each terminal, and checks whether a predetermined threshold is reached with respect to the battery life, based on the received information and on operational parameters, such as the conditions of use, that have been input for each terminal; when it is determined that the threshold is reached, the host compares the end-of-life time of the battery with the next scheduled maintenance time, and determines whether the terminal is to be indicated as a terminal for which preventive measures can be taken. The results are edited and output for each store and for each terminal so that the maintenance and management of the batteries can be performed on a store-by-store basis.

In the battery monitoring system of this embodiment, the battery state information managed by the CPU built in each terminal includes the total operating time during which the terminal has been operated by the battery, the number of recharges that have been performed on the battery, and the change of the actual operating time during which the terminal has been operated on a single charge.

Figure 1:
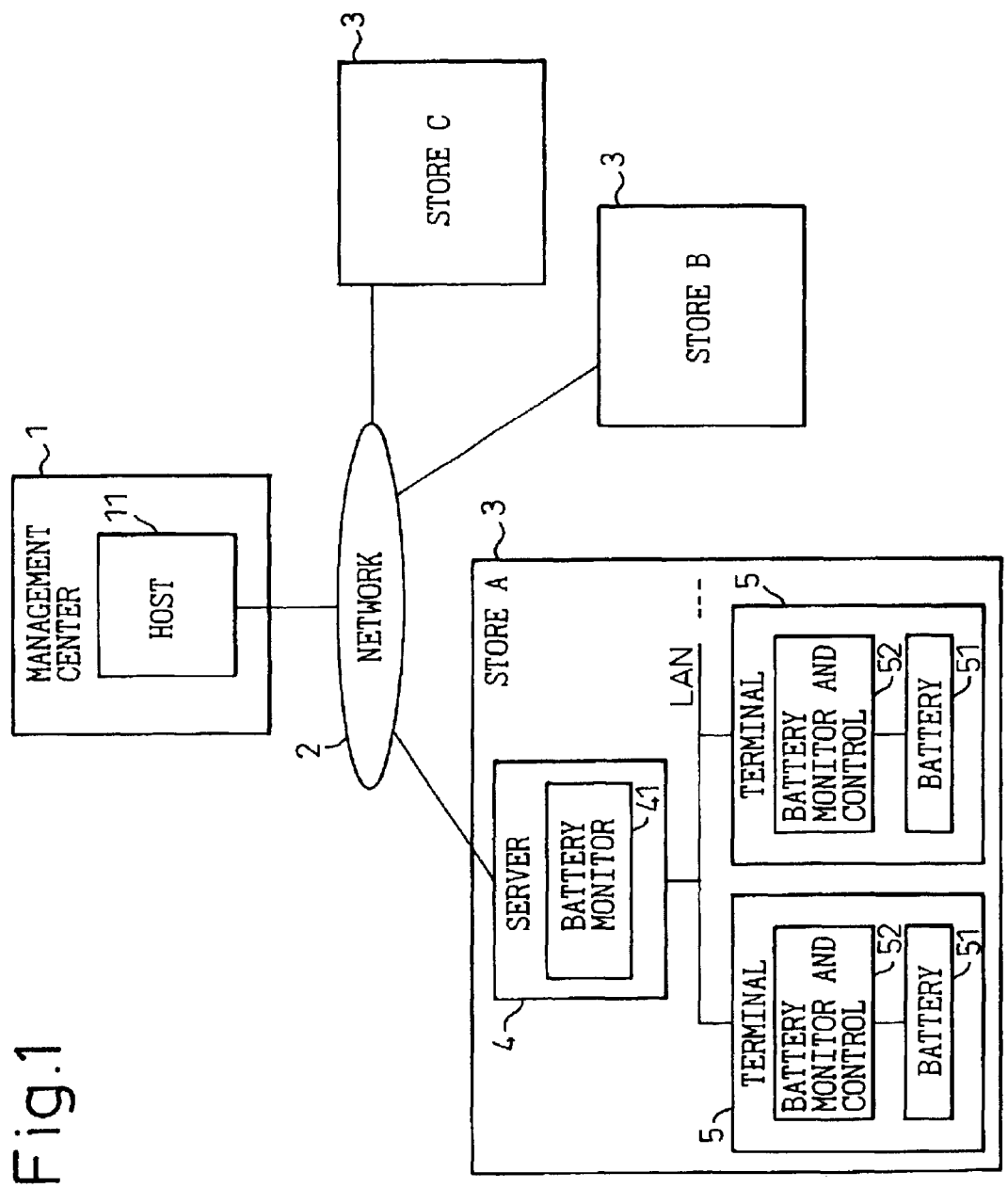
FIG. 1 is a schematic diagram for explaining the configuration of a battery monitoring system according to the present embodiment as applied to terminals installed within a retail store.

A specific implementation of the battery monitoring system of this embodiment is shown in FIG. 1 which illustrates the overall configuration of the system for the case where a plurality of information terminals are installed in each retail store.

In the figure, the management center 1 is connected to a plurality of stores 3 via a network 2 for two-way information communications, and the host 11 placed in the management center 1 manages the entire system on a store-by-store basis. The network 2 is constructed using a WAN, public network, or the like. The plurality of stores 3 connected are represented in the figure by the stores A to C. A specific example of how the in-store electronic apparatuses are connected is shown here for the store A.

As shown, a plurality of information terminals 5 are installed as the electronic apparatuses in the store A, and each terminal 5 is capable of transmitting and receiving information to and from an in-store server 4 via an in-store LAN. Each terminal 5 may be a notebook computer or a portable information terminal such as a handheld terminal or a palmtop terminal. The terminals need not necessarily be connected via the LAN, but may be connected by a wireless link, the only requirement being that each terminal be equipped with an interface capable of performing communications with the server 4.

A battery 51 as a power supply is mounted in each terminal 5. Each terminal contains a battery monitoring and control unit 52 for monitoring and controlling the battery state of the battery 51, and the information gathered here is transmitted to a battery monitoring unit 41 provided in the server 4.

Here, the terminals 5 belong to each individual store and are managed on a store-by-store basis; as many terminals as can be managed by the server 4 may be installed in the store. The type of terminal is not limited to one particular type, but different types of terminals may be installed; in any case, each terminal is of the type that has a battery for operating it and is equipped with the battery monitoring and controlling unit 52 for the battery. The terminals 5 may include a terminal that is used not only within the store but also outside the store and has the capability to communicate with the server 4 via the network 2.

The configuration within the stores B and C is not shown here, but the configuration is similar to that shown for the store A; furthermore, though only three stores are shown for convenience of illustration, the number of stores is not limited to the specific example shown here.

Figure 2:
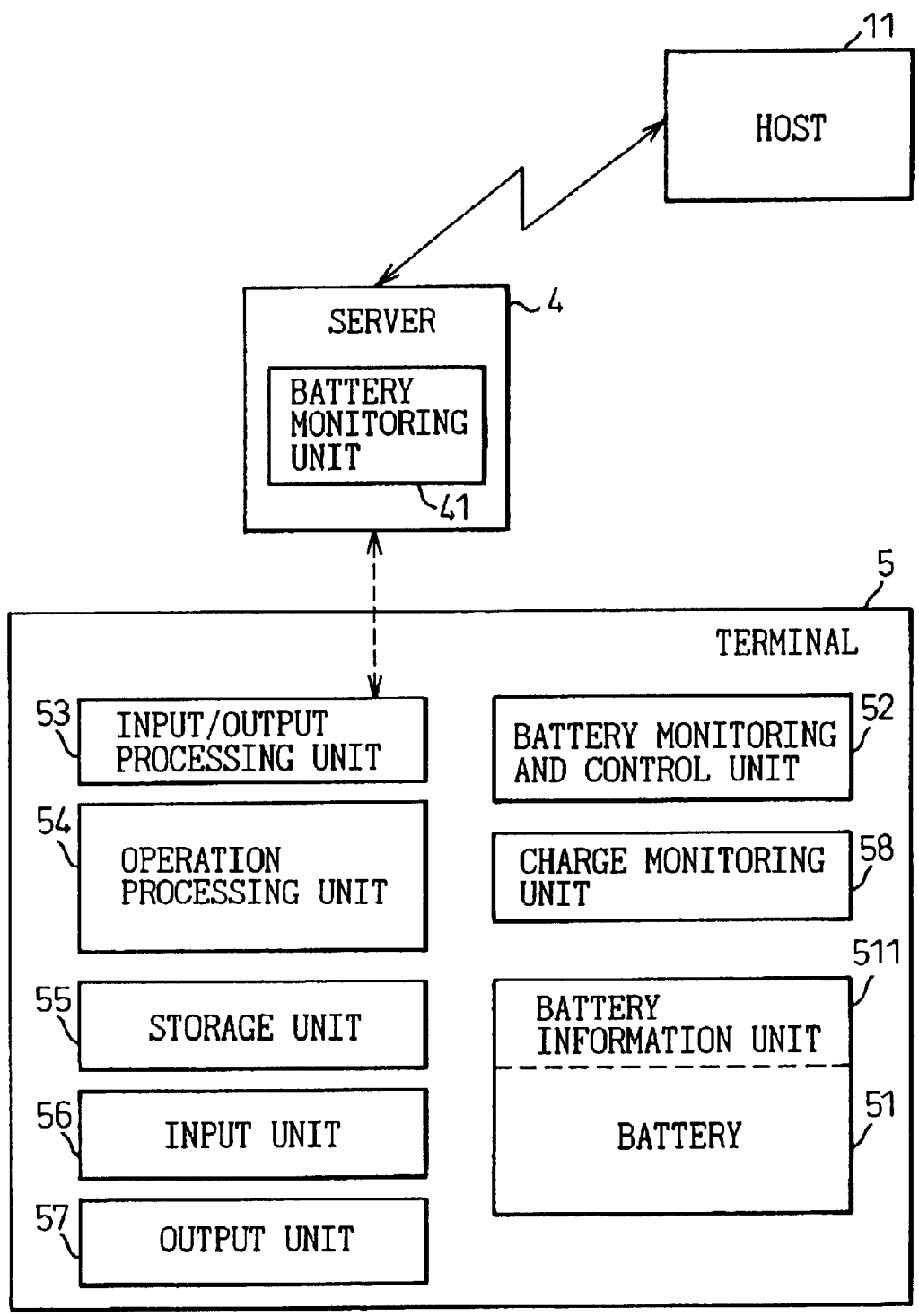
FIG. 2 is a schematic block diagram for explaining the configuration of a terminal to which the battery monitoring system according to the present embodiment is applied.

FIG. 2 shows in functional block diagram form the internal configuration of one particular terminal 5 used in the store A shown in FIG. 1. In FIG. 2, the same elements as those in FIG. 1 are designated by the same reference numerals.

The terminal 5 has the functions of an ordinary information terminal, and hence comprises an input/output processing unit 53, an operation processing part 54, a storage unit 55, an input unit 56, and an output unit 57. The input/output processing unit 53 is an interface for performing information transmission and reception to and from the in-store server 4. The operation processing unit 54 contains a main CPU, performs the system management of the entire terminal 5, and performs information processing as an information terminal in accordance with a program which includes an OS stored in the storage unit 55.

The input unit 56, which includes a keyboard, mouse, touch panel, and the like attached to the terminal, is used to input necessary information to the terminal and is equipped with a GUI via which information can be input. The output unit 57 includes a display having a screen such as an LCD, a printer, a speaker, etc., and is used to output the results of the information processing performed in the terminal 5.

The battery 51 for operating the terminal 5 is incorporated in the terminal 5. Alternatively, the battery 51 may be connected externally to the terminal. In the example of FIG. 2, the battery information concerning the battery 51 is gathered by a battery information unit 511 comprising an information chip built into the battery 51 itself.

The terminal 5 also includes the battery monitoring and control unit 52 which constitutes the feature of this embodiment; a charge monitoring unit 58 for managing the charging of the battery 51 is also included. The battery monitoring and control unit 52 may be constructed using the main CPU of the operation processing unit 54, but in the illustrated example, the control unit 52 is constructed using a sub CPU provided separately from the main CPU and used exclusively for battery monitoring and control. The usual functions of the information terminal are performed by the main CPU, while the battery monitoring and control is performed solely by the sub CPU.

The storage unit 55 provided in the terminal 5 includes a ROM, which stores programs necessary for the operation of the information terminal, such as the OS program for the terminal, an information processing program, etc., and a RAM, which is used for system operation. In the present embodiment, the ROM also stores a battery monitoring and control program. Alternatively, a storage medium special for the battery monitoring and control program may be provided.

A storage area capable of storing battery state information, battery setting information, etc. is provided in the RAM of the storage unit 55. If a dedicated storage medium such as a RAM or flash memory capable of storing these pieces of information is provided separately from the above RAM, it will be advantageous from the standpoint of monitoring and control. The battery state information stored in the RAM is a log of the monitored battery voltage, the number of battery recharges, the time required for recharging, etc.

The battery setting information stored in the storage unit 55 includes an operational parameter that defines the consumption level index according to the conditions of use of the battery 51; this operational parameter is input by the user of the terminal 5 via a dedicated GUI provided in the input unit 56 to set the battery maintenance information.

The condition of battery consumption varies depending on the environment where the terminal 5 is used, for example, a cold temperature environment, a moderate temperature environment, or a hot temperature environment, and further on the frequency of use; therefore, the consumption level index can be divided into a plurality of levels (for example, five levels) according to the conditions of use, for example, ranging from the optimum environment to the worst environment for the use of the battery. Considering the conditions of use of the battery, the user initially sets the appropriate consumption level index via the GUI each time the battery is replaced. The thus set consumption level index is updated and changed according to the frequency with which the terminal is operated by the battery.

Figure 3:
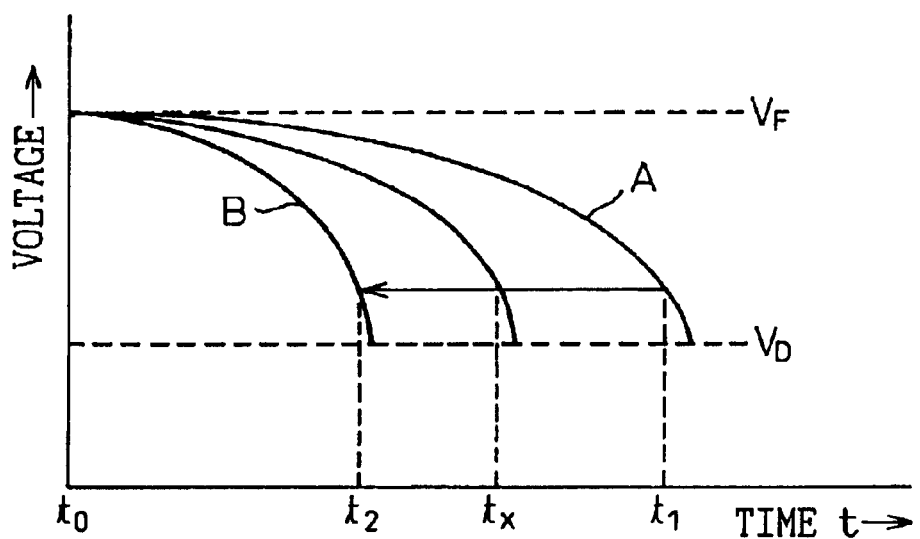
FIG. 3 is a diagram for explaining a monitoring mode for monitoring a change in actual operating time as depicted by the state of discharge of a rechargeable battery after a single recharge.

The storage unit 55 also stores a monitoring mode graph used to determine the end-of-life time of the mounted battery. This monitoring mode graph is shown in FIG. 3. In the graph, the abscissa represents the operating time t of the battery on a single full charge, and the ordinate represents the battery output voltage V as a function of the time t. In the graph, time $t_0$ indicates the time at which the full charging of the battery is completed, and the battery voltage in the fully charged state is denoted by $V_F$.

Generally, the output voltage of a rechargeable battery drops as the discharge progresses and the available capacity decreases, and the output voltage finally drops off to a level barely enough to operate the apparatus. The battery is then recharged. When the battery is discharged and recharged repeatedly, the discharge characteristics of the battery degrade, and the output voltage V of the battery after a full charge tends to drop at a faster rate, thus shortening the operating time t during which the battery can provide a specified voltage.

In the graph of FIG. 3, curve A shows the discharge characteristic of a new battery from the start of operation after a full charge, while curve B shows the discharge characteristic, from the start of operation after a full charge, of a battery whose service life is nearing an end. In the graph, the battery output voltage $V_F$ in a fully charged condition, that is, at the start of operation, is denoted as 100% and, when the available capacity of the battery drops to 20%, it is determined that the battery has reached a state that needs recharging; the battery output voltage corresponding to this state is designated by $V_D$. The battery output voltage V after each recharge is monitored, and when the voltage $V_D$ is detected, the battery is recharged.

In the graph of FIG. 3, when the length of the operating time $t_x$ of the battery is within the range bounded by the curves A and B, it is determined that the battery is operating in a healthy condition. For example, when the operating time shown by the curve A relative to a predetermined voltage is denoted as $t_1$, and the operating time shown by the curve B as $t_2$, then the time $t_x$ at which the battery output voltage V drops to the predetermined voltage is monitored and, when the length of the time $t_x$ is within the range between time $t_1$ and time $t_2$, it is determined that the battery has not yet reached the end of its life, and thus an instruction can be issued to have the battery recharged. On the other hand, when the time $t_x$ is close to time $t_2$, then it can be determined that the battery has reached the end of its life; in this case, a maintenance notification directing the replacement of the battery is issued.

Alternatively, time $t_D$, at which the battery output voltage V in the discharge characteristics shown in FIG. 3 reaches the voltage $V_D$ that requires a recharge, is monitored; then, by comparing its accumulated value with the expected life of the battery expressed in hours, it can be determined whether the battery has reached the end of its life.

Further, since there is a limit to the number of times a rechargeable battery can be discharged and recharged, the maximum number of recharges is specified for the battery. In view of this, the charge monitoring unit 58 monitors the number of recharges that have been performed on the battery or the number of times that the recharge requiring voltage $V_D$ has been reached, and compares the result with the maximum number of times that the battery can be recharged; in this way, it can be determined whether the battery has reached the end of its life.

Information concerning these battery characteristics varies for each battery product, and can be acquired through experiment at the time of product development. If this information is prerecorded, for example, in the information chip built in the battery pack, the information can be read into the storage unit 55 when the battery is newly installed in the terminal 5. Alternatively, provisions may be made for the user of the terminal 5 to enter the above information together with the expected life of the battery expressed in operating hours, the maximum number of times it can be recharged, etc., by using the maintenance setting special GUI of the input unit 56.

While a battery has a discharge characteristic unique to it, the discharge characteristic varies depending on the conditions of use of the battery; as a result, by just making settings based on the rated information of the battery and comparing the monitored information with the rated information, the decision as to whether the battery has actually reached the end of life may not be made correctly. In view of this, in order to make the decision as close as possible to the actual situation, provisions are made to be able to set the consumption level index according to the conditions of use of the battery so that the criterion for determining whether the end of life is reached can be changed according to the battery used. As earlier described, the consumption level index reflecting the conditions of use of the battery is input via the battery maintenance information setting GUI of the input unit 56, and is stored in the storage unit 55, thus making initial settings for the battery operating environment each time the battery is replaced.

Operation of the battery monitoring system of this embodiment as applied to the above-configured terminal 5 will be described with reference to the flowchart of FIG. 4.

First, when the terminal 5 is started up, the sub CPU internal to the terminal 5 starts to operate; when a battery state monitor instruction is issued (step S1), the battery monitoring and control unit 52 starts real-time monitoring of the battery state of the battery 51 mounted in the terminal 5 (step S2). Here, the time elapsing from the start of monitoring is recorded in the RAM of the storage unit 55 by the system timer in the main CPU and the OS. The time recorded here corresponds to the operating time of the terminal 5, i.e., the time during which the battery 51 is being discharged. When the battery 51 is replaced by a new one, the monitoring process is reset.

The terminal 5 is equipped with a dedicated GUI for maintenance information setting and, via this GUI, the user of the terminal refers to or initializes the information managed in the battery monitoring and control unit 52. This GUI is also used when setting the consumption level index appropriate to the conditions of the operating environment, such as temperature, frequency of use, etc., that affect the battery consumption.

The battery monitoring and control unit 52 acquires the battery state information concerning the battery 51 from the battery information unit 511 (step S3). The battery state information includes the battery output voltage V being delivered to operate the terminal 5. The battery monitoring and control unit 52 checks the degree of drop in the battery output voltage V by comparing the battery output voltage V with the recharge requiring voltage $V_D$ such as shown in FIG. 3 (step S4).

Here, the drop in the output voltage is checked to monitor how far the remaining capacity of the battery has dropped and, when the remaining capacity has dropped to a predetermined level, the output unit 57 is instructed to issue a warning message.

When the battery output voltage V is compared with the recharge requiring voltage $V_D$ that has been set as a threshold (step S5), if it is higher than the threshold (N), there is no need to recharge the battery 51 as yet, that is, the monitoring of the battery output voltage V should be continued (step S6); therefore, the process returns to step S2.

On the other hand, if the battery output voltage V being monitored has dropped to the threshold in step S5 (Y), the battery monitoring and control unit 52 determines that the battery 51 needs a recharge, and instructs the output unit 57 to produce a warning message or alarm indicating that the battery needs recharging (step S7). At this time, the battery monitoring and control unit 52 measures the operating time of the terminal 5 operated by the battery 51, and stores it in the storage unit 55. A warning message saying, for example, "CAUTION! Battery voltage is low. Recharge the battery" is displayed on the screen of the output unit 57.

Then, the charge monitoring unit 58, which monitors the charging of the battery 51 performed by the user of the terminal 5, sends battery recharge start and end notifications to the battery monitoring and control unit 52 (step S8).

The battery monitoring and control unit 52 monitors the number of battery recharges based on the received time, and increments the number by one each time this battery recharge-related time is received. Then, the number of battery recharges in the battery charge information stored in the storage unit 55 is updated (step S9).

Here, the time required for recharging is monitored based on the battery recharge start time and end time reported in step S8, together with the number of recharges for the same battery. Based on the state of the power consumed for recharging, the charge monitoring unit 58 recognizes that the battery 51 has been fully charged, and the battery monitoring and control part 52 manages the battery 51 as 100% charged. If the recharge is stopped before the fully charged state is recognized, the amount of charge is calculated from the charge time and the charge rate per unit time provided in the battery specification, and the final amount of charge is determined by adding the calculated amount to the remaining amount of charge. In this case also, the number of recharges is incremented by one by determining that the battery recharge has been accomplished.

Further, the battery monitoring and control unit 52 monitors the battery output voltage V after the completion of the battery recharge, and turns off the warning message, charge lamp, and other related indications after confirming that the battery output voltage indicates the fully charged voltage $V_F$. Each time the process from step S2 to step S9 is repeated, the battery monitoring and control unit 52 monitors how much the battery output voltage V of the battery 51 after completion of each recharge has dropped (step S10).

The battery monitoring and control unit 52 can be configured to monitor how much the battery output voltage V after each recharge drops, by referring to the time that elapses from the completion of the recharging of the battery 51 to the time that the warning message is output. By referring to the change in the time that elapses until the warning message is output, the change is reflected as required in the initially set consumption level index, and the changed index is stored together with the initially set index. Here, the criterion for changing the index is determined in advance; for example, in cases where the warning message is output over and over, it is determined that the battery consumption level is high, causing the battery life to shorten, and the initially set consumption level index is changed. The consumption level index can also be changed by reference to the frequency of recharge of the battery.

The monitoring of the change in the voltage drop in step S10 is performed based on the monitoring mode graph shown in FIG. 3. The time $t_x$ at which the battery output voltage V drops to the predetermined voltage stored in the storage unit 55 is measured. The time $t_x$ corresponds to the operating time measured in step S2. The time $t_x$ is compared with the time $t_2$ stored in the storage unit 55, and if it is determined that the time $t_x$ is close to the time $t_2$, then it is assumed that the time $t_x$ indicates the time that the battery 51 has reached the end of its life. If the predetermined voltage used here is set equal to the recharge requiring voltage $V_D$, then the time $t_x$ corresponds to the time at which the warning message is output.

Here, by determining that the battery 51 has reached the end of its life, the battery monitoring and control unit 52 issues a battery maintenance request, for example, by displaying on the screen of the output unit 57 a message notifying that it is time to replace the battery (step S11).

In step S10, the determination as to the end-of-life time of the battery has been made by monitoring the change in the voltage drop, but instead of monitoring the change in the voltage drop, the determination may be made by constantly monitoring the accumulated value of the operating time measured in step S2 or the number of recharges counted in step S9.

In step S2, the battery monitoring and control part 52 performs real-time monitoring of the battery state of the battery 51 mounted in the terminal 5, and the operating time relating to the same battery is thus acquired. The total operating time relating to the same battery can be monitored based on the thus acquired operating time. The end-of-life time of the battery can be predicted by comparing the total operating time with the expected life of the battery expressed in operating hours.

The total operating time during which the terminal 5 has been operated by the battery 51 is computed based on the information at the time of initial operation and initialization. The total time here is computed by adding up the length of operating time between the time that the terminal 5 is power off or power is turned off due to suspension and the next time that the terminal 5 is power off or power is turned off due to suspension, and these states are monitored by the battery monitoring and control unit 52. The total operating time is computed by adding up the times calculated by referring to the consumption level index.

Figure 4:
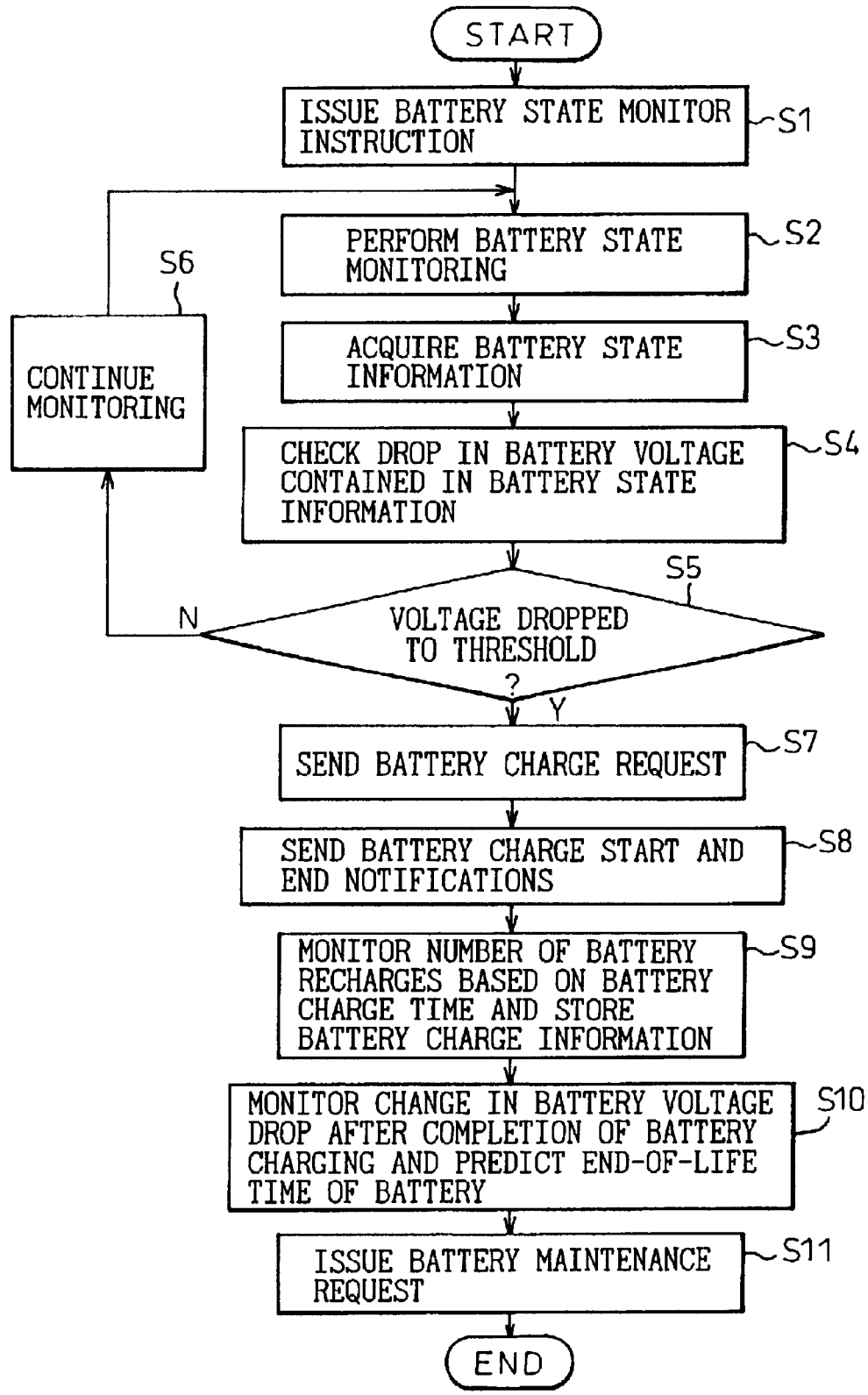
FIG. 4 is a flowchart for explaining the sequence of operations performed in the battery monitoring system according to the present embodiment.

The prediction of the end-of-life time of the battery so far described has been performed by the battery monitoring and control unit 52 monitoring the change in the battery output voltage drop, but the end-of-life time of the battery can also be predicted by monitoring an error event occurring in relation to the battery 51 during the process from step S2 to step S9 in the flowchart of FIG. 4.

In this case, the battery monitoring and control unit 52 acquires an error log relating to the battery 51, and logs the error event and the number of occurrences thereof. For example, depending on the error event, it may become necessary to replace the battery even when it is the first occurrence; in that case, when an error occurs, it is determined that the end of life is reached, and the battery maintenance request is issued.

The battery monitoring system of the present embodiment has been described above by focusing on the operation within one particular terminal, but as shown in FIG. 1, a plurality of terminals 5 are used in each store in a client/server environment. Operation of the battery monitoring system for that case will be described below. Operation within each terminal 5 is the same as that described above.

The battery state information concerning the battery 51 mounted in each terminal 5 is monitored and managed by the battery monitoring and control unit 52 in the terminal. All the terminals 5 belonging to the store 3 are managed by the battery monitoring unit 41 in the in-store server 4. The battery state information received from each terminal 5 is transmitted in real time to the host 11 in the management center 1 upon request by the host 11.

The battery state information is transmitted from each terminal 5 to the server 4 at predetermined intervals of time, for example, once a day, and the transmitted information is centrally managed within the server 4 together with the information from the other terminals. The information managed within the server 4 is transferred from the server 4 to the host 11 in real time upon request by the host 11.

At the host 11, the battery state information transferred from the server 4 is centrally managed on a store-by-store basis and on a terminal-by-terminal basis. The battery state information includes such information as total operating time, number of recharges, and actual operating time for each terminal. The values of these pieces of information are checked against the respectively set thresholds, and any terminal for which it can be deduced, based on the total operating time, number of recharges, and consumption level index, that the battery has reached the end of its life, is indicated.

At the host 11, the change of the battery consumption state in each terminal is monitored and the end-of-life time is predicted for each terminal; therefore, the predicted time is compared with the time at which the next maintenance is scheduled to be done. By also considering the maintenance cycle of maintenance personnel, any terminal whose battery is expected to reach the end of its life before the next scheduled maintenance time is indicated as a terminal for which preventive measures can be taken. Further, any terminal that needs special attention, by judgement from the number of occurrences of logged error events, is indicated on a store-by-store basis as a terminal that needs preventive measures.

The above has described the case where the operating conditions of the batteries mounted in the plurality of terminals are centrally managed by the host installed in the management center and battery replacement and maintenance work is performed on a store-by-store basis; alternatively, provisions may be made to centrally manage the battery operating conditions of the plurality of terminals by the server and to perform battery replacement and maintenance work by treating the plurality of terminals as a group.

As described above, at the host or the server, any terminal for which preventive measures can be taken by the prediction of the battery end-of-life time and any terminal that exhibited a battery fault are indicated on a store-by-store basis or on a group-by-group basis in accordance with the conditions of the batteries mounted in the respective terminals; this facilitates the battery replacement and maintenance work and serves to enhance the efficiency of the maintenance work. This also has the effect of enabling the battery to be replaced at the appropriate time.

As described above, as the end-of-life time of the battery mounted in each terminal is predicted by monitoring the battery for the total operating time, the number of recharges, and the change in the actual operating time after each recharge and by considering the battery consumption level index, the battery lifetime that varies from battery to battery and also varies depending on the conditions of use and the battery's own characteristics can be accurately determined for each battery, and the battery can be replaced with a new one at the appropriate time.

Even when a plurality of battery-operated electronic apparatuses are installed in a retail store or the like, as the battery state information concerning the respective electronic apparatuses is centrally managed at the host, as described above, if the conditions of use differ among the electronic apparatuses, and the battery life varies among them, the end-of-life time of each battery can be determined individually, thus making it possible to avoid unnecessary battery replacement and to take preventive measures against battery trouble, and battery replacement and maintenance work can be performed efficiently, effectively, and appropriately, for example, on a store-by-store basis.

While the invention has been described with reference to specific embodiments chosen for purpose of illustration, it should be apparent that numerous modifications could be made thereto by those skilled in the art without departing from the basic concept and scope of the invention.

The present disclosure relates to subject matter contained in Japanese Patent Application No. 2002-60485, filed on Mar. 6, 2002, the disclosure of which is expressly incorporated herein, by reference, in its entirely.

What is claimed is:

1. A battery monitoring system comprising:
   monitoring means for gathering battery state information concerning a plurality of batteries respectively mounted in a plurality of electronic apparatuses;
   controlling means for predicting when each of the batteries approaches an end of battery life, based on the battery state information, and for producing end time information concerning each battery for which the approaching end of battery life has been predicted; and
   output means for outputting the end time information produced by the controlling means.

2. The battery monitoring system as claimed in claim 1, wherein the battery state information for a specific one of the batteries comprises total operating time during which a corresponding one of the electronic apparatuses has been operated by the specific battery mounted therein.

3. The battery monitoring system as claimed in claim 2, wherein the total operating time is obtained by detecting a power off state of the corresponding electronic apparatus and by sequentially adding up the operating time during which the corresponding electronic apparatus has been operated by the specific battery.

4. The battery monitoring system as claimed in claim 1, wherein the battery state information for a specific one of the batteries comprises the number of recharges that have been performed on the specific battery mounted in a corresponding one of the electronic apparatuses.

5. The battery monitoring system as claimed in claim 4, further comprising charge monitoring means for counting the number of recharges and for monitors charging of the specific battery.

6. The battery monitoring system as claimed in claim 1, wherein the battery state information for a specific one of the batteries comprises an actual operating time during which a corresponding one of the electronic apparatuses has been operated by the specific battery on a single charge after completion of charging.

7. The battery monitoring system as claimed in claim 6, wherein the actual operating time is obtained by measuring the time elapsed from the completion of charging until a battery output voltage being monitored by the battery monitoring means drops to a predetermined voltage.

8. The battery monitoring system as claimed in claim 1, wherein, when a battery output voltage included in the battery state information for a specific one of the batteries has dropped to a level at which the specific battery needs recharging, the output means outputs a low battery warning for the specific battery.

9. The battery monitoring system as claimed in claim 1, wherein the controlling means predicts, for a specific one of the batteries, when the specific battery approaches the end of battery life by comparing the battery state information with a preset threshold value.

10. The battery monitoring system as claimed in claim 9, wherein the controlling means, when predicting the approaching end of battery life of the specific battery, refers to a consumption level index that has been set according to conditions of use of the specific battery.

11. The battery monitoring system as claimed in claim 1, wherein for a specific one of the batteries, the controlling means acquires the battery state information including an error event associated with the specific battery mounted in a corresponding one of the electronic apparatuses and the number of occurrences thereof, and predicts the of battery life of the specific battery, based on the battery state information.

12. The battery monitoring system as claimed in claim 1, wherein, for a specific one of the batteries, when an approaching end of battery life of the specific battery is predicted, the output means outputs a replacement and maintenance request for the specific battery.

13. The battery monitoring system as claimed in claim 1, wherein the electronic apparatuses are information terminals, and the output means transmits the battery state information and the end time information, including the end-of-life time, at periodic intervals to a server connected to the information terminals.

14. The battery monitoring system as claimed in claim 13, wherein the server selects, based on the transmitted end time information, any information terminal that is to receive battery maintenance during a next scheduled maintenance.

15. The battery monitoring system as claimed in claim 14, wherein the server is provided in a retail store and manages a plurality of the information terminals, and wherein the server transfers the battery state information and the end time information to a host connected to the server, and the host selects, for each of the stores, any information terminal that is to receive battery maintenance during the next scheduled maintenance.

16. A method of monitoring batteries, comprising:

gathering battery state information concerning a plurality of batteries respectively mounted in plurality of electronic apparatuses;

predicting when each of the batteries approaches an end of battery life, based on the battery state information, and producing end time information concerning each battery for which the approaching end of battery life has been predicted; and outputting the end time information.

17. A battery monitoring system, comprising:

a monitoring unit gathering battery state information concerning a plurality of batteries respectively mounted in a plurality of electronic apparatuses;

a controlling unit predicting when each of the batteries approaches an end of battery life, based on the battery state information, and producing end time information concerning each battery for which the approaching end of battery life has been predicted; and an output unit outputting the end time information.

* * * * *

UNITED STATES PATENT AND TRADEMARK OFFICE
CERTIFICATE OF CORRECTION

PATENT NO.    : 6,768,287 B2
DATED         : July 27, 2004
INVENTOR(S)   : Yoshiki Oosaki It is certified that error appears in the above-identified patent and that said Letters Patent is hereby corrected as shown below:

Column 12,
Line 8, change "monitors" to -- monitoring --
Line 38, after "wherein" insert -- , --
Line 42, after "the" insert -- end --

Column 13,
Line 6, after "in" insert -- a --

Signed and Sealed this

Twenty-second Day of February, 2005

JON W. DUDAS
*Director of the United States Patent and Trademark Office*